(12) United States Patent
Hiyoshi

(10) Patent No.: US 10,685,901 B2
(45) Date of Patent: Jun. 16, 2020

(54) BOILING COOLING DEVICE

(71) Applicants: Hyundai Motor Company, Seoul (KR); Kia Motors Corporation, Seoul (KR)

(72) Inventor: Michiaki Hiyoshi, Kanagawa (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 0 days.

(21) Appl. No.: 16/195,958

(22) Filed: Nov. 20, 2018

(65) Prior Publication Data

US 2019/0363035 A1 Nov. 28, 2019

(51) Int. Cl.
*H01L 23/427* (2006.01)
*F28F 13/18* (2006.01)
*F28F 3/04* (2006.01)
*F28D 15/02* (2006.01)

(52) U.S. Cl.
CPC ........ *H01L 23/427* (2013.01); *F28D 15/0266* (2013.01); *F28F 3/048* (2013.01); *F28F 13/187* (2013.01); *F28F 2260/02* (2013.01)

(58) Field of Classification Search
None
See application file for complete search history.

(56) References Cited

U.S. PATENT DOCUMENTS

| 8,564,953 | B2 * | 10/2013 | Horiuchi | H01L 23/473 257/707 |
| 2004/0163797 | A1 * | 8/2004 | Cosley | F25B 39/022 165/80.4 |
| 2011/0048676 | A1 * | 3/2011 | Toyoda | F28D 1/05366 165/104.21 |
| 2011/0168222 | A1 * | 7/2011 | Lee | H01G 9/21 136/205 |
| 2013/0025826 | A1 * | 1/2013 | Sakamoto | F28D 15/0266 165/104.21 |
| 2013/0258594 | A1 * | 10/2013 | Gradinger | F28D 15/02 361/700 |
| 2015/0241094 | A1 * | 8/2015 | Blomberg | F25B 39/02 62/119 |

(Continued)

FOREIGN PATENT DOCUMENTS

| JP | 2011-047616 A | 3/2011 |
| JP | 2013-155925 A | 8/2013 |

*Primary Examiner* — Alexander G Ghyka
(74) *Attorney, Agent, or Firm* — Mintz Levin Cohn Ferris Glovsky and Popeo, P.C.; Peter F. Corless

(57) ABSTRACT

A boiling cooling device e includes a power semiconductor that is vertically disposed, heat radiating plates provided on both side faces of the power semiconductor, heat receiving jackets provided at both sides of the power semiconductor and covering the heat radiating plates, refrigerant filled in the heat receiving jackets and being in contact with the heat radiating plates, a condenser connected to the heat receiving jackets, and fine longitudinal grooves formed on a heat radiating face of the heat radiating plate and extending in a vertical direction, where creation of air bubbles is promoted by heat generated in the power semiconductor and by the fine longitudinal grooves, the created air bubbles rising and passing through a forward pipe and then reaching the condenser to be liquefied, such that liquid is returned to the heat receiving jacket via a return pipe.

8 Claims, 11 Drawing Sheets

(56) References Cited

U.S. PATENT DOCUMENTS

| | | | |
|---|---|---|---|
| 2016/0338226 A1* | 11/2016 | Sakamoto | F28D 15/0266 |
| 2019/0006269 A1* | 1/2019 | Xu | H01L 21/4828 |
| 2019/0008078 A1* | 1/2019 | Waddell | F28D 15/0266 |
| 2019/0293306 A1* | 9/2019 | Taniguchi | H05K 7/20 |

* cited by examiner

FIG. 8

|  | CRITICAL HEAT FLUX (W/cm²) |
|---|---|
| NO GROOVE (FLAT FACE) | 147 |
| FINE TRANSVERSE GROOVE | 144 |
| FINE LONGITUDINAL GROOVE | 175 |
| MESH-SHAPED GROOVES | 185 |

A-A CROSS-SECTINAL VIEW

BOILING COOLING DEVICE

CROSS-REFERENCE TO RELATED APPLICATION

This application claims under 35 U.S.C. § 119(a) the benefit of Japanese Patent Application No. 2018-99850 filed on May 24, 2018, the entire contents of which are incorporated herein by reference.

BACKGROUND

(a) Technical Field

The present disclosure relates to a boiling cooling device, more particularly, to the boiling cooling device capable of efficiently cooling a power semiconductor mounted in a vehicle.

(b) Description of the Related Art

FIG. 15 (RELATED ART) is a view illustrating an example of a conventional double-side cooling type power semiconductor. As illustrated in FIG. 15, a power semiconductor 1 is employed for controlling power in an inverter, and generates heat. Accordingly, water cooling tubes 2 provided above and below the power semiconductor 1 are filled with refrigerant 3 to allow the refrigerant to cool the power semiconductor 1 from both sides using forced convection. In this configuration, thermal conductive lubricant 4 is formed between the power semiconductor 1 and the water cooling water tube 2, and thus heat radiation is restricted. This is because thermal conductivity of the thermal conductive lubricant 4 is as low as about 3 W/mK. In addition, when a fin of the water cooling tube 2 has a complicated shape, the pressure loss is increased, so that there is a limit to a reduction in thermal resistance between the water cooling tube and the and the refrigerant 3. When the circulating amount of the refrigerant 3 is increased, the thermal resistance is lowered, but it is required to increase the pump capacity, and there is a limitation in terms of cost and a receiving space. Therefore, a boiling cooling method which can perform high heat radiation without using a pump is expected, but a critical heat flux due to boiling does not fluctuate at a value of about 180 W/cm$^2$. In the next-generation devices such as a SiC-MOSFET and the like, a chip area becomes smaller, so that the critical heat flux that has been used so far is not sufficient, and it is required to improve the critical heat flux to about 500 W/cm$^2$.

In a cooling system for an electronic device disclosed in Japanese Publication No. 2011-047616, an L-shaped vaporization promoting plate 313 is installed via a heat conductive lubricating oil 210 on a semiconductor device 200 and is covered with a heat receiving jacket, and water Wa acting as refrigerant is circulated in the vaporization promoting plate. The refrigerant is boiled and evaporated by heat of the semiconductor device under the reduced pressure, flows into a condenser 320, is cooled in a cooling fan, is liquefied and is then returned to the heat receiving jacket again. The vaporization promoting plate is made of a copper plate, and a plurality of fine angular holes of 0.2 mm×0.2 mm are provided on a face of the above plate at intervals of pitch of 0.5 mm in length and width. When the refrigerant in the angular hole is boiled, it is evaporated and takes away heat. However, the air bubbles generated on a horizontal plane of the vaporization promoting plate are not largely grown. Further, vertical faces of the L-shaped vaporization promoting plate vaporize the attached refrigerant in a portion above a liquid level of the refrigerant, and all the faces do not have a function of suppressing a diameter of each air bubble or rectifying the air bubbles.

In a boiling cooler disclosed in Japanese Publication No. 2013-155925, a semiconductor device H which is laid down is cooled by boiling coolers M disposed on both upper and lower sides. The boiling cooler M has liquid refrigerant 3A and gas refrigerant 3B received therein, and a porous body 5 creating air bubble using heat of the semiconductor device H and an attachment part 4 surrounding the porous body are installed in the liquid refrigerant 3A. The air bubbles created in a communication hole 8 pass through a gas flow passage 6 of the attachment part 4 and then rise. However, since the air bubbles pass through the communication hole 8 and the horizontal gas passage 6, the air bubbles are hardly discharged smoothly, and a dry out (or burn out) by which cooling effect is lowered may be generated.

The above information disclosed in this Background section is only for enhancement of understanding of the background of the disclosure and therefore it may contain information that does not form the prior art that is already known in this country to a person of ordinary skill in the art.

SUMMARY

An object of the present disclosure is to provide a boiling cooling device which can improve heat flux to improve heat radiation performance.

A boiling cooling device according to the present disclosure may include a power semiconductor that is vertically disposed, heat radiating plates provided on both left and right side faces of the power semiconductor, respectively, heat receiving jackets provided at both left and right sides of the power semiconductor, and configured to cover the heat radiating plates, respectively, refrigerant filled in the heat receiving jackets and configured to be in direct contact with the heat radiating plates, a condenser connected to the heat receiving jackets via a forward pipe and a return pipe; and a plurality of fine longitudinal grooves formed on a heat radiating face of the heat radiating plate and extending in a vertical direction, wherein air bubbles may be created on the fine longitudinal grooves provided on the heat radiating face by heat generated in the power semiconductor, the air bubbles rising and passing through the forward pipe and then reaching the condenser to be liquefied, and liquid is returned to the heat receiving jacket via the return pipe.

Another boiling cooling device according to the present disclosure may include a power semiconductor that is vertically disposed, heat radiating plates provided on both left and right side faces of the power semiconductor, respectively, heat receiving jackets provided at both left and right sides of the power semiconductor, and configured to cover the heat radiating plates, respectively, refrigerant filled in the heat receiving jackets and configured to be in direct contact with the heat radiating plates, a condenser connected to the heat receiving jackets via a forward pipe and a return pipe, and mesh-shaped grooves formed on a heat radiating face of the heat radiating plate and including a plurality of fine longitudinal grooves extending in a vertical direction and a plurality of fine transverse grooves intersecting the fine longitudinal grooves and extending in a horizontal direction, wherein creation of air bubbles is promoted by heat generated in the power semiconductor and by the mesh-shaped grooves provided on the heat radiating face, the generated air bubbles rising and passing through the forward pipe and then reaching the condenser to be liquefied, and liquid is returned to the heat receiving jacket via the return pipe.

Here, the fine longitudinal grooves may have a width of 50 μm or less.

In addition, the fine longitudinal grooves may be formed by laser machining of the heat radiating face.

Other aspects and preferred embodiments of the disclosure are discussed infra.

BRIEF DESCRIPTION OF THE DRAWINGS

The above and other features of the present disclosure will now be described in detail with reference to certain exemplary embodiments thereof illustrated in the accompanying drawings which are given hereinbelow by way of illustration only, and thus are not limitative of the present disclosure, and wherein:

FIGS. 4A and 4B are explanatory views showing states in which air bubbles are created on a face of the heat radiating plate, wherein FIG. 4A illustrates a case in which the grooves are directed in a vertical direction, and FIG. 4B illustrates a case in which the grooves are directed in a horizontal direction;

FIG. 8 is a table summarizing a critical heat flux;

Figure 1:
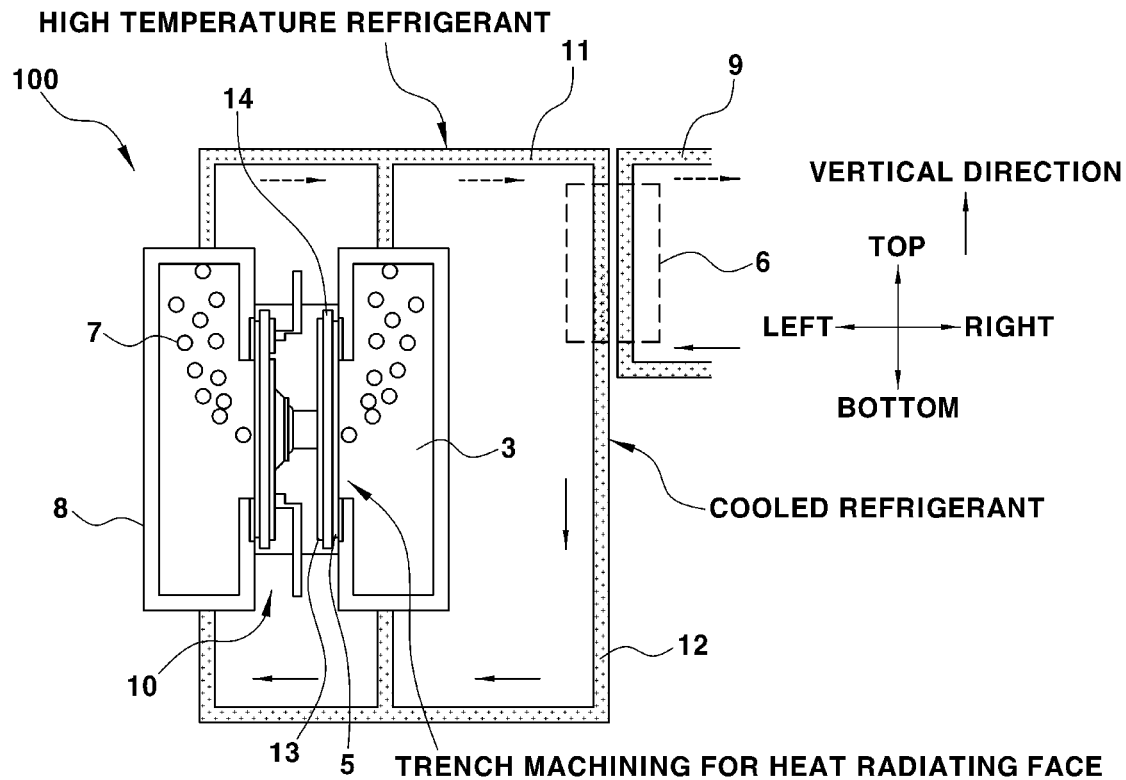
FIG. 1 is a schematic view of a boiling cooling device according to the present disclosure.

It should be understood that the appended drawings are not necessarily to scale, presenting a somewhat simplified representation of various preferred features illustrative of the basic principles of the disclosure. The specific design features of the present disclosure as disclosed herein, including, for example, specific dimensions, orientations, locations, and shapes will be determined in part by the particular intended application and use environment.

In the figures, reference numbers refer to the same or equivalent parts of the present disclosure throughout the several figures of the drawing.

DETAILED DESCRIPTION

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

The terminology used herein is for the purpose of describing particular embodiments only and is not intended to be limiting of the disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Throughout the specification, unless explicitly described to the contrary, the word "comprise" and variations such as "comprises" or "comprising" will be understood to imply the inclusion of stated elements but not the exclusion of any other elements. In addition, the terms "unit", "-er", "-or", and "module" described in the specification mean units for processing at least one function and operation, and can be implemented by hardware components or software components and combinations thereof.

Further, the control logic of the present disclosure may be embodied as non-transitory computer readable media on a computer readable medium containing executable program instructions executed by a processor, controller or the like. Examples of computer readable media include, but are not limited to, ROM, RAM, compact disc (CD)-ROMs, magnetic tapes, floppy disks, flash drives, smart cards and optical data storage devices. The computer readable medium can also be distributed in network coupled computer systems so that the computer readable media is stored and executed in a distributed fashion, e.g., by a telematics server or a Controller Area Network (CAN).

Hereinafter reference will now be made in detail to various embodiments of the present disclosure, examples of which are illustrated in the accompanying drawings and described below. While the disclosure will be described in conjunction with exemplary embodiments, it will be understood that present description is not intended to limit the disclosure to those exemplary embodiments. On the contrary, the disclosure is intended to cover not only the exemplary embodiments, but also various alternatives, modifications, equivalents and other embodiments, which may be included within the spirit and scope of the disclosure as defined by the appended claims.

In order to clearly describe the present disclosure, parts which are not related to the description are omitted, and the same reference numerals are used for indicating the same or similar components throughout the drawings and detail description.

Hereinafter, a boiling cooling device according to embodiments of the present disclosure are described in detail with reference to the accompanying drawings.

FIG. 1 is a schematic view of a boiling cooling device 100 according to the present disclosure.

A power semiconductor 10 is a device for controlling power, and is used in a rectifier circuit for converting an alternating current into a direct current, an inverter circuit for converting a direct current into an alternating current, or a voltage booster circuit for boosting a voltage. Due to the large heating value, the power semiconductor 10 needs to be cooled. As illustrated in FIG. 1, the power semiconductor 10 is arranged to allow left and right heat radiating faces to be vertical faces. Ceramic substrates (DBC substrate) 5, 14, and 13 are provided on both right and left side faces of the power semiconductor 10. The DBC substrate is an abbreviation of a direct bonded copper substrate, and refers to a ceramic insulating substrate having a cooper circuit formed thereon. One side member (outer side member) 5 of the ceramic substrate 5, 14, 13 becomes a heat radiating plate. Trench machining can be performed on the heat radiating plate.

Heat-receiving jackets 8 are provided on both right and left sides of the power semiconductor 10 to cover the heat radiating plates 5. The heat-receiving jacket 8 is made of aluminum. The heat-receiving jacket 8 and the power semiconductor 10 are joined to each other by an O-ring, soldering, or sintering to seal the heat radiating plate 5. An internal space of the heat-receiving jacket 8 is filled with refrigerant 3 such as pure water or antifreeze solution. The refrigerant 3 is in direct contact with a heat radiating face of the heat radiating plate 5. Due to this configuration, heat is directly transferred from the heat radiating plate 5 to the refrigerant 3. When the power semiconductor 10 generates heat, air bubbles 7 are created on the heat radiating face of the heat radiating plate 5. The air bubbles 7 rise in a vertical direction. Here, the heat-receiving jackets 8 are connected to a water-cooled condenser 6 via a forward pipe 11 and a return pipe 12. The high temperature refrigerant 3 containing the air bubbles 7 is moved to the condenser 6 through the forward pipe 11, and is then cooled in the condenser 6. The air bubbles 7 are liquefied in the condenser and then returned to the heat-receiving jackets 8, 8 via the return pipe 12. A temperature of cooling water 9 which is heat-exchanged in the condenser 6 may be increased to about 65° C. The high-temperature refrigerant 3 flows in the forward pipe 11 and is heat-exchanged in return pipe 12, so that the refrigerant 3 whose temperature has been lowered flows. The refrigerant 3 may flow (or be circulated) by natural convection. That is, the above operation may be performed without using a pump. The present invention is not limited to the above configuration, and may be provided with a pump having a small discharge flow rate to circulate the refrigerant 3.

Embodiment 1

Figure 2:
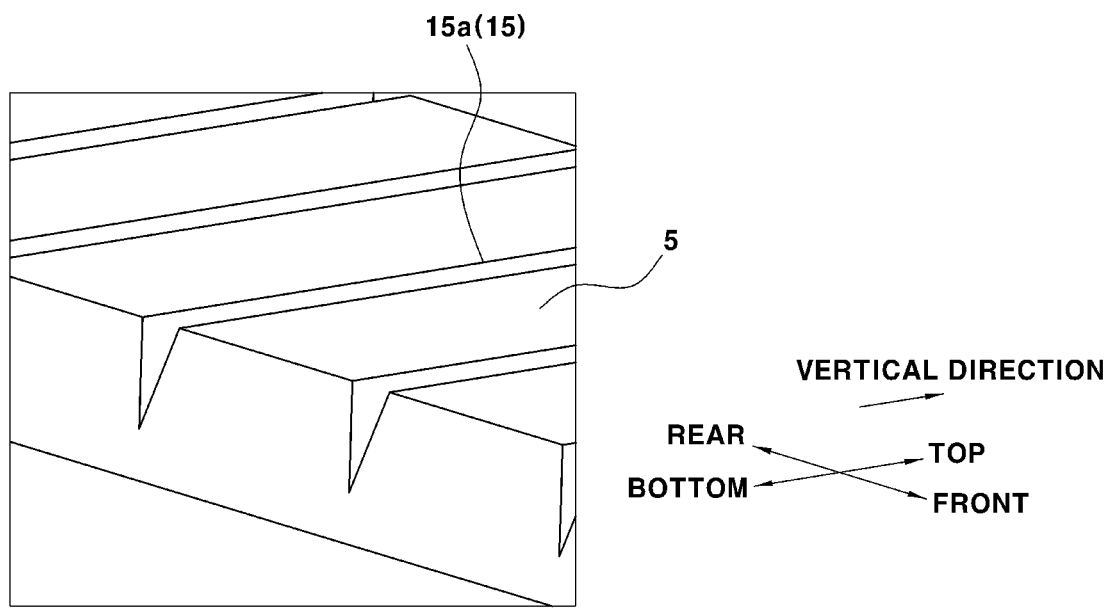
FIG. 2 is a view illustrating one example of trench machining in which grooves are formed on a heat radiating plate to be directed in one direction.

FIG. 2 is a view illustrating one example of trench machining in which grooves 15 are formed on the heat radiating plate 2 to be directed in one direction. As shown in FIG. 2, the groove 15 is a V-shaped groove having a V-shaped cross section, and a width of the groove (a width between both top ends of the V-shaped groove) is smaller than a width between the grooves (a distance from the top end (right side) of the V-shaped groove to a top end (left side) of the adjacent groove). Since a direction indicated from "the top" is a vertical direction, the heat radiating plate 5 in which the grooves 15 are composed of fine longitudinal grooves 15a extending in the vertical direction may be made. Further, when a direction indicated from "the front" is defined as the vertical direction, the grooves 15 become fine transverse grooves 15b.

Embodiment 2

Figure 3:
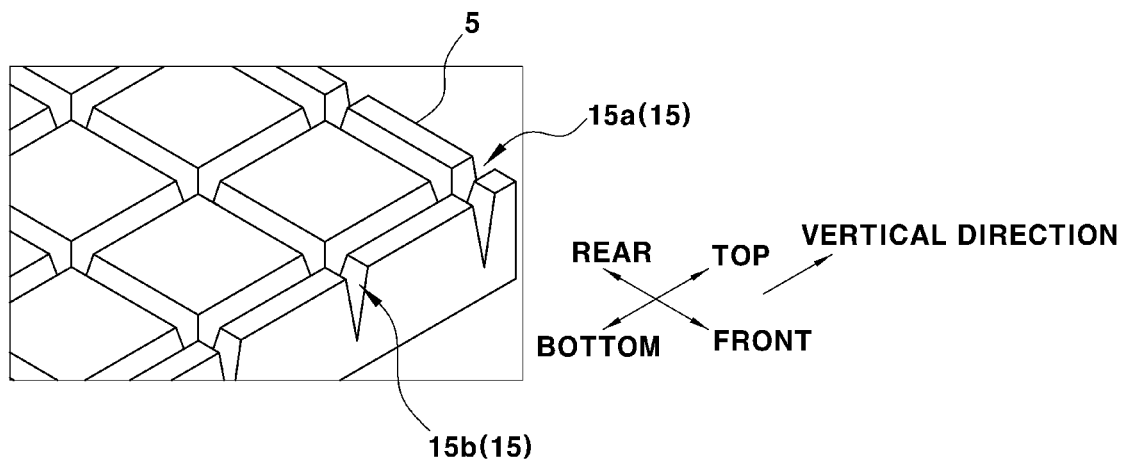
FIG. 3 is a view illustrating one example of trench machining in which the grooves are formed on the heat radiating plate in a mesh (lattice) shape.

FIG. 3 is a view illustrating one example of trench machining in which the grooves are formed on the heat radiating plate 3 in a mesh (lattice) shape. As shown in FIG. 3, the groove 15 is a V-shaped groove having a V-shaped cross section, and a width of the groove (a width between both top ends of the V-shaped groove) is smaller than a width between the grooves (a distance from the top end (right side) of the V-shaped groove to a top end (left side) of the adjacent groove). As illustrated in FIG. 3, since a direction indicated from "the top" is a vertical direction, the heat radiating plate 5 in which the grooves 15 are composed of the fine longitudinal grooves 15a extending in the vertical direction and the fine transverse grooves 15b in a horizontal direction may be made. A heat radiation evaluation was conducted using the heat radiating plate sample A having the mesh-shaped grooves composed of the fine longitudinal grooves and the fine transverse grooves, the heat radiating plate sample B having the fine longitudinal grooves, the heat radiating plate sample C having the fine transverse grooves, and the heat radiating plate sample D having no groove as samples of the heat radiating plate 5. In addition, ethylene glycol of 30 weight % was used as the refrigerant 3 of the antifreeze solution. Ethylene glycol has been frequently used as the antifreeze solution because it is easily soluble in water.

Figure 4A:
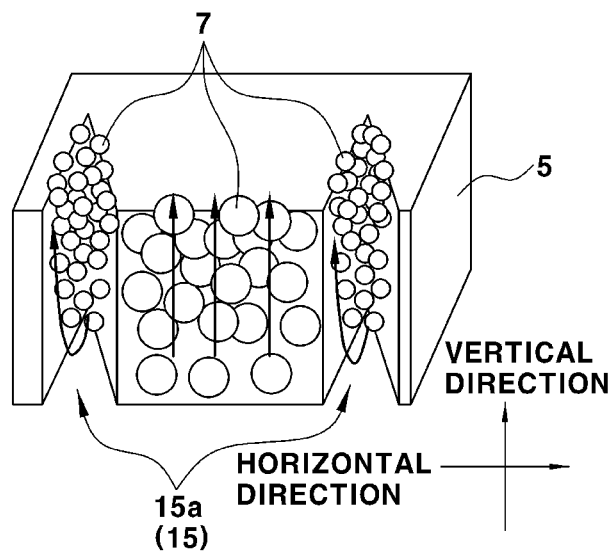
Figure 4B:
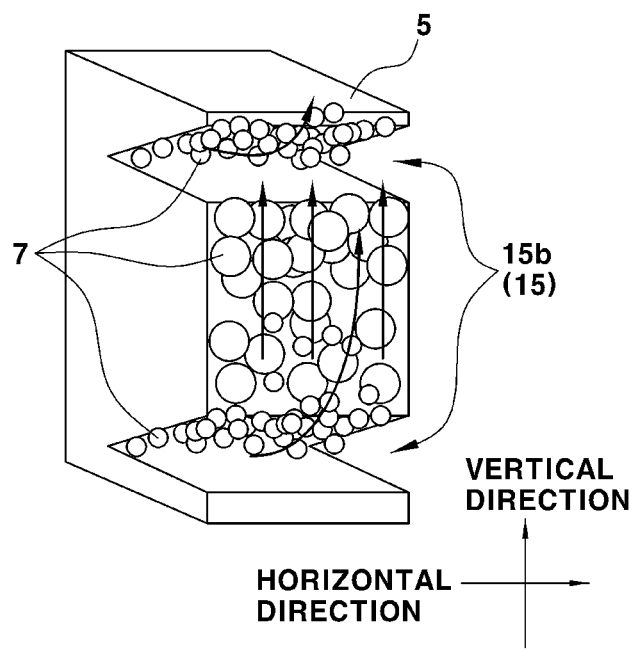

FIGS. 4A and 4B are explanatory views showing states in which the air bubbles 7 are created on a face of the heat radiating plate 3, wherein FIG. 4A illustrates a case in which the grooves 15 are directed in the vertical direction, and FIG. 4B illustrates a case in which the grooves 15 are directed in the horizontal direction. As illustrated in FIGS. 4A and 4B, a diameter of the air bubble 7 created in the groove 15 is suppressed in a widthwise direction of the groove, and thus the air bubble 7 becomes a small air bubble. Therefore, it is easy to condense the air bubbles 7 and to improve the heat radiation performance. In addition, it is also possible to increase a heat flux (W/cm$^2$). As illustrated in FIG. 4A, when the groove 15 is the fine longitudinal groove 15a extending in the vertical direction, the flow of the air bubbles 7 is rectified, and the air bubble 7 in the groove does not coalesce with the air bubbles 7 on a flat plane. As illustrated in FIG. 4B, when the groove 15 is the fine transverse groove 15b extending in the horizontal direction, the flow of the air bubbles 7 is mixed with the air bubbles 7 on the flat plane, and thus the air bubbles 7 are easy to be grown. In the heat flux, the fine longitudinal groove, which suppresses a growth of the air bubble 7 and is directed in the vertical direction illustrated in FIG. 4A, is superior. In order to improve the heat flux, it is effective to form the fine longitudinal groove in the vertical direction.

Figure 5:
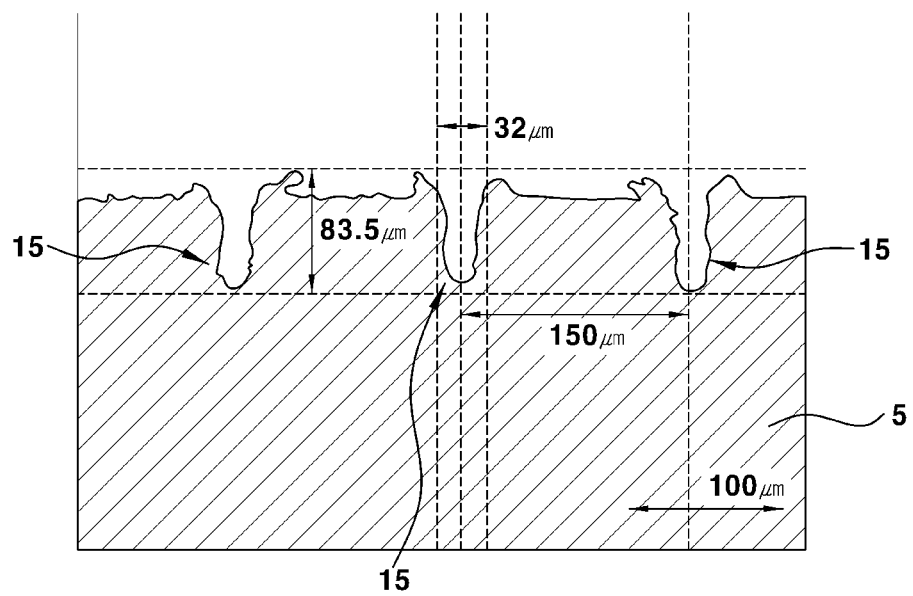
FIG. 5 is a photomicrograph illustrating a cross section of a heat radiating face of the heat radiating plate shown in FIG. 1.

FIG. 5 is a photomicrograph illustrating a cross section of the heat radiating face of the heat radiating plate 5 shown in FIG. 1. A laser was employed in the trench machining. As illustrated in FIGS. 4A and 4B, the grooves were formed to have a pitch between the grooves of approximately 150 μm, a depth of the groove of approximately 80 μm and a width of the groove of approximately 30 μm. In the examples of FIGS. 4A and 4B, the groove pattern was formed in a mesh shape although only a cross section in one direction is shown. As compared with the heat radiating face having no groove, a surface area of the heat radiating face having the mesh-shaped grooves is increased by approximately two times and a heat transfer rate is improved by about two times.

Figure 6:
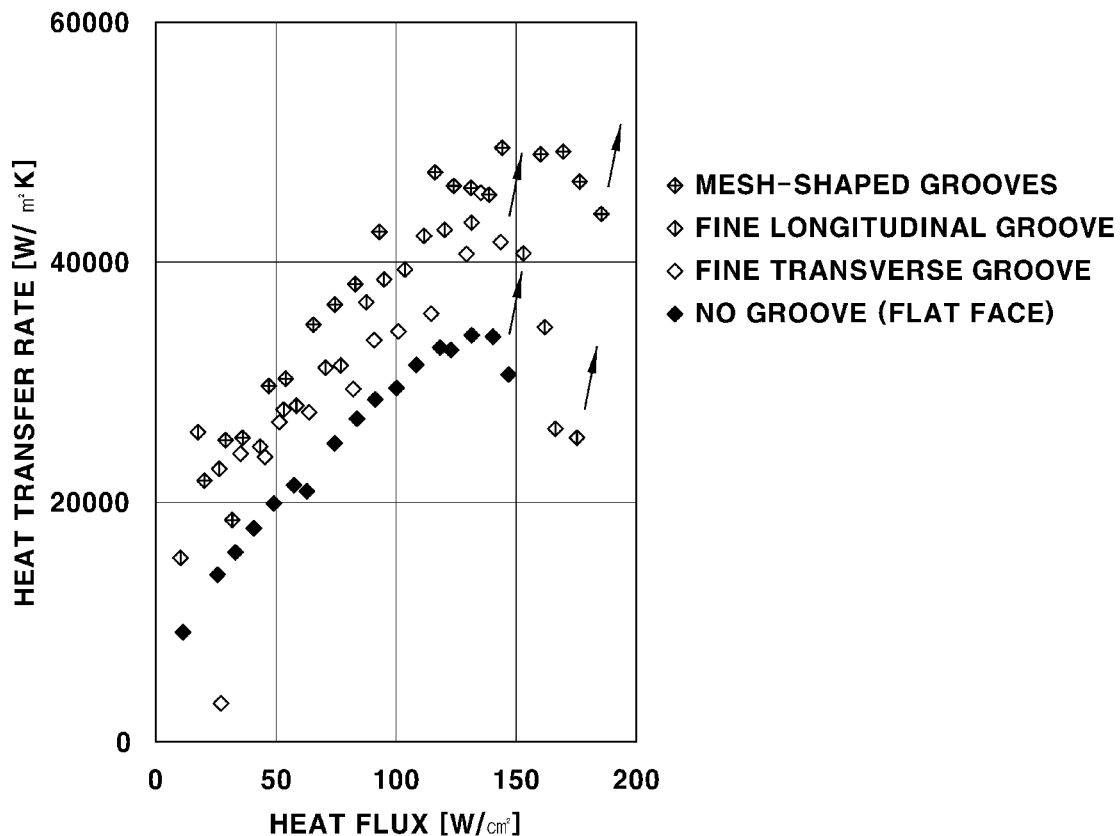
FIG. 6 is a graph illustrating a relation between a heat flux and a heat transfer rate.
Figure 7:
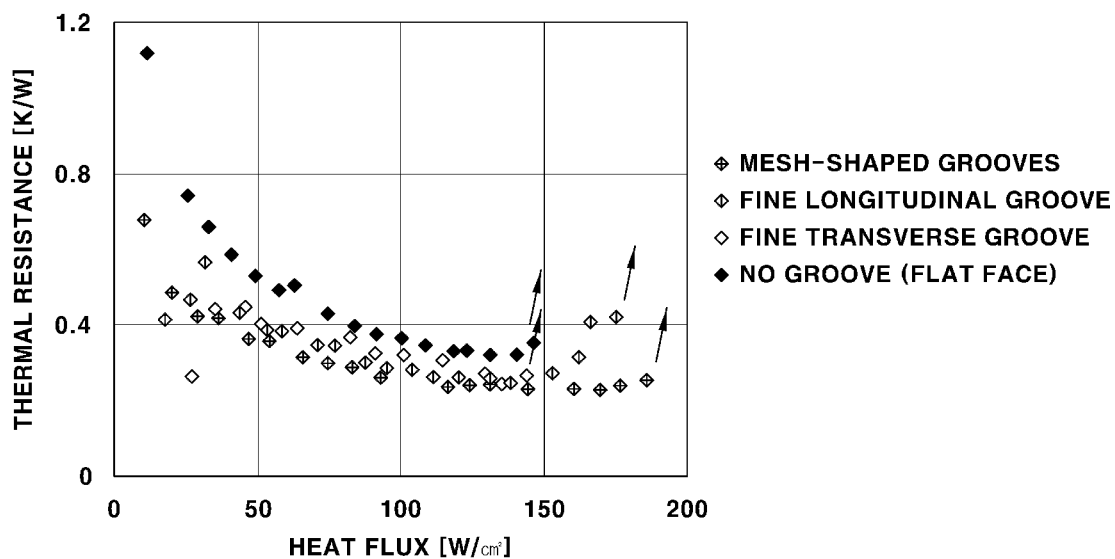
FIG. 7 is a graph illustrating a relation between the heat flux and the thermal resistance.

FIG. 6 is a graph illustrating a relation between a heat flux and a heat transfer rate, FIG. 7 is a graph illustrating a relation between the heat flux and the thermal resistance, and FIG. 8 is a table summarizing a critical heat flux. The above graphs show the results of evaluating the heat radiating plate having the mesh-shaped grooves, the heat radiating plate having the fine longitudinal grooves, the heat radiating plate having the fine transverse grooves and the heat radiating plate having no groove. The heat radiating plate having the fine transverse groove has low thermal resistance (see FIG. 7) and improved heat radiation performance as compared with the heat radiating plate having no groove. However, as illustrated in FIG. 8, a critical heat flux of the heat radiating plate having the fine transverse groove is 144 (W/cm$^2$) whereas the critical heat flux of the heat radiating plate having no groove is 147 (W/cm$^2$). In other words, the critical heat flux is not so improved. Thermal resistance of the heat radiating plate having the fine longitudinal groove is much smaller than that of the heat radiating plate having the fine transverse groove or having no groove (see FIG. 6), and the heat radiation performance is improved. In addition, as illustrated in FIG. 8, the critical heat flux is 175 (W/cm$^2$) and is significantly improved. The heat radiating plate having the mesh-shaped grooves has much lower thermal resistance (see FIG. 7) and has the critical heat flux of 185 (W/cm$^2$), and both the heat radiation performance and the critical heat flux are improved. From these, it can be seen that it is important for the heat radiating plate to include the fine longitudinal groove. It can be seen that, in order to improve the heat radiation performance and the critical heat flux, it is preferable to provide the fine longitudinal grooves in the vertical direction with high density. In FIGS. 6 and 7, in addition, the arrows marked at the right of the graphs indicate the positions of the critical heat fluxes corresponding to the respective grooves.

Figure 9A:
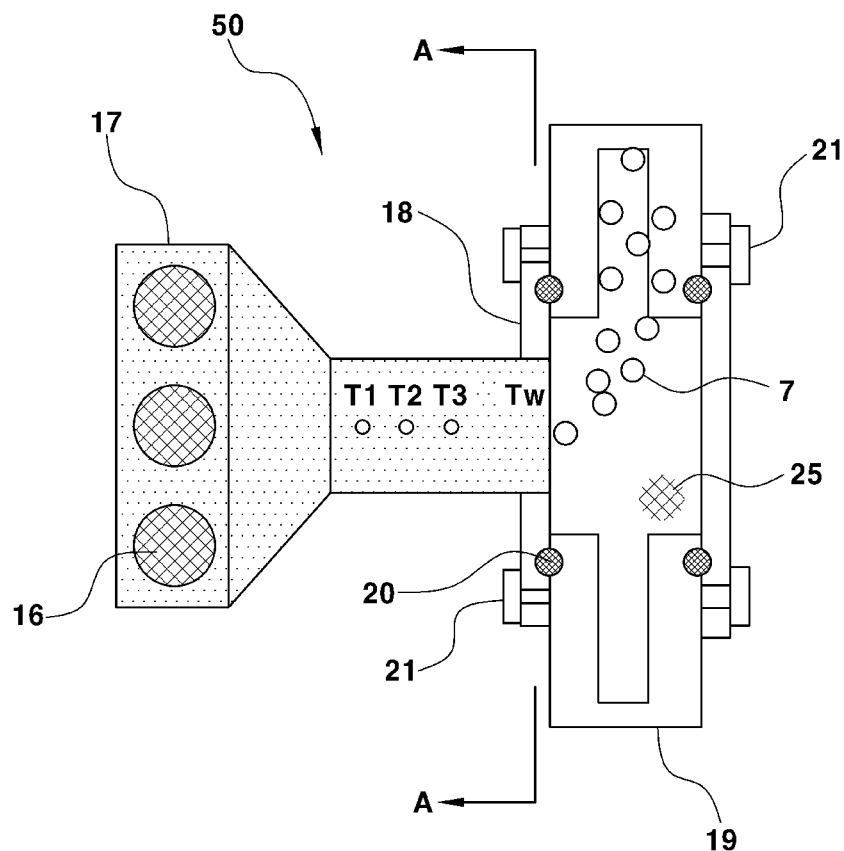
FIGS. 9A and 9B are explanatory views of an evaluation equipment measuring heat radiation performance.
Figure 9B:
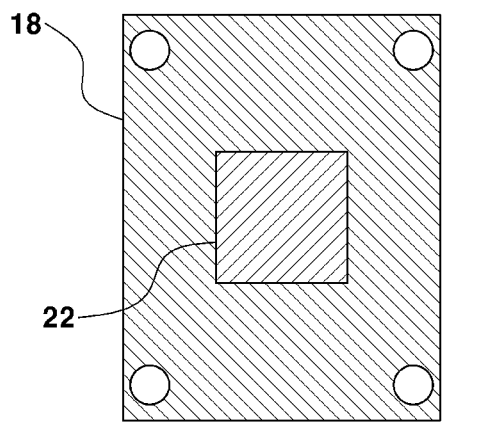

FIGS. 9A and 9B are explanatory views of an evaluation equipment measuring heat radiation performance. As illustrated in FIG. 9A, an evaluation equipment 50 includes a heater 16 of 500 W, a bronze block 17, a backlight insulating plate 18 and an aluminum jacket 19. The aluminum jacket 19 is filled with refrigerant 25. In addition, the aluminum jacket 19 and the backlight insulating plate 18 are sealed by a seal ring 20 and are then fixed to each other by a screw 21. FIG. 9B is a cross-sectional view taken along line A-A of FIG. 9A, and a section 22 has a dimension of size of 1 cm×1 cm in length and width. Heat was generated by the heater 16 and a heat radiating face of 1 cm×1 cm was brought into contact with the refrigerant 3 of the antifreeze solution to create the air bubbles 7. A temperature of each point was also measured.

Figure 10:
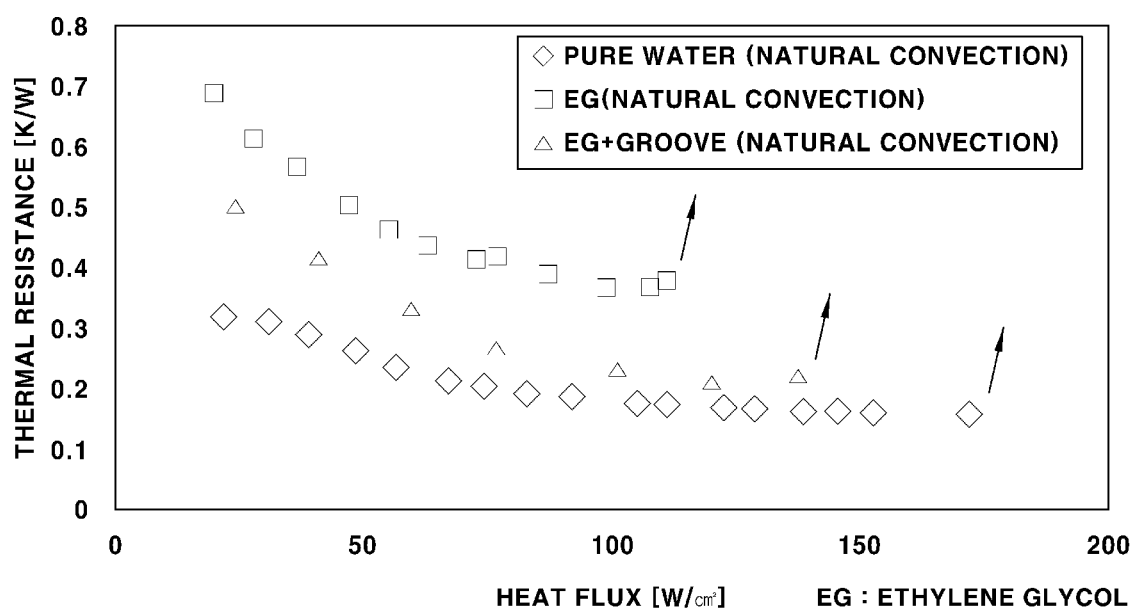
FIG. 10 is a graph illustrating a relation between the heat flux and the thermal resistance.

FIG. 10 is a graph illustrating a relation between the heat flux and the thermal resistance.

Three cases, that is, the case A in which the refrigerant is pure water, the case B in which the refrigerant 25 contains the antifreeze solution of 50% ethylene glycol, and the case C in which the refrigerant 25 contains the antifreeze solution of 50% ethylene glycol and the groove is formed on the heat radiating face of a bronze block were measured using the evaluation equipment 50. The refrigerant of pure water was compared with the refrigerant of the antifreeze solution. Since the antifreeze solution of 50% ethylene glycol is slightly viscous, the case B is easy to be burnt out as compared with the case A. The arrows at the right of the graph indicate the burn out (the critical heat flux point). In general, the case B is used as the heat flux below the burn out, so that the case B deteriorates cooling performance. Like the case C, however, when the groove is provided on the heat radiating face, a critical point of the antifreeze solution caused by the burn out may be approached to the refrigerant of pure water. That is, it is possible to improve the thermal resistance by directly contacting the heat radiating face with the refrigerant and performing trench machining on the heat radiating face.

Figure 11:
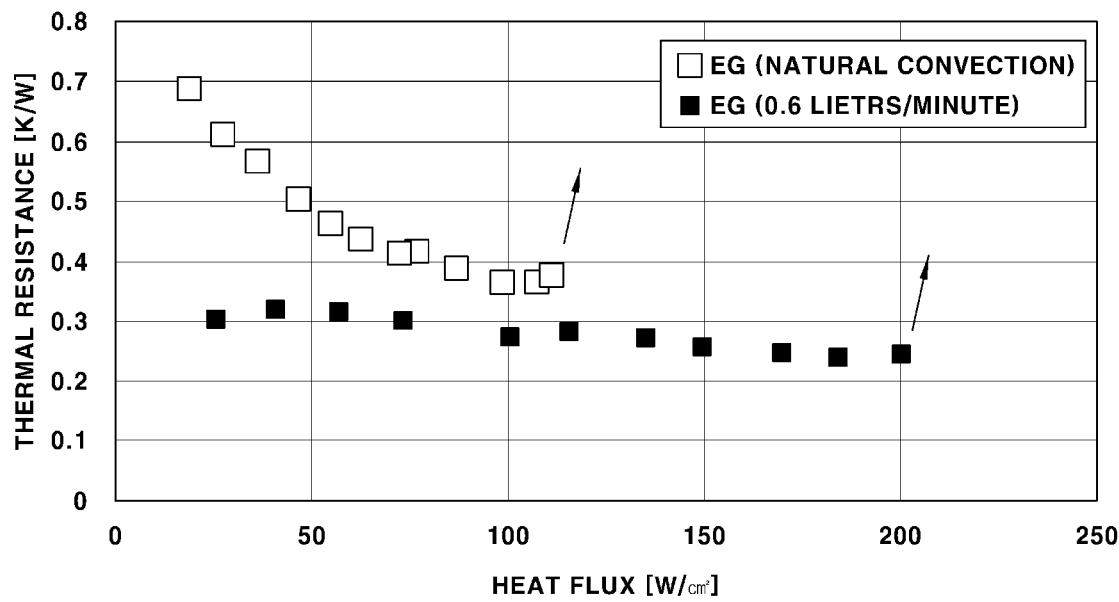
FIG. 11 is a graph illustrating a relation between the heat flux and the thermal resistance.

FIG. 11 is a graph illustrating a relation between the heat flux and the thermal resistance.

Figure 12:
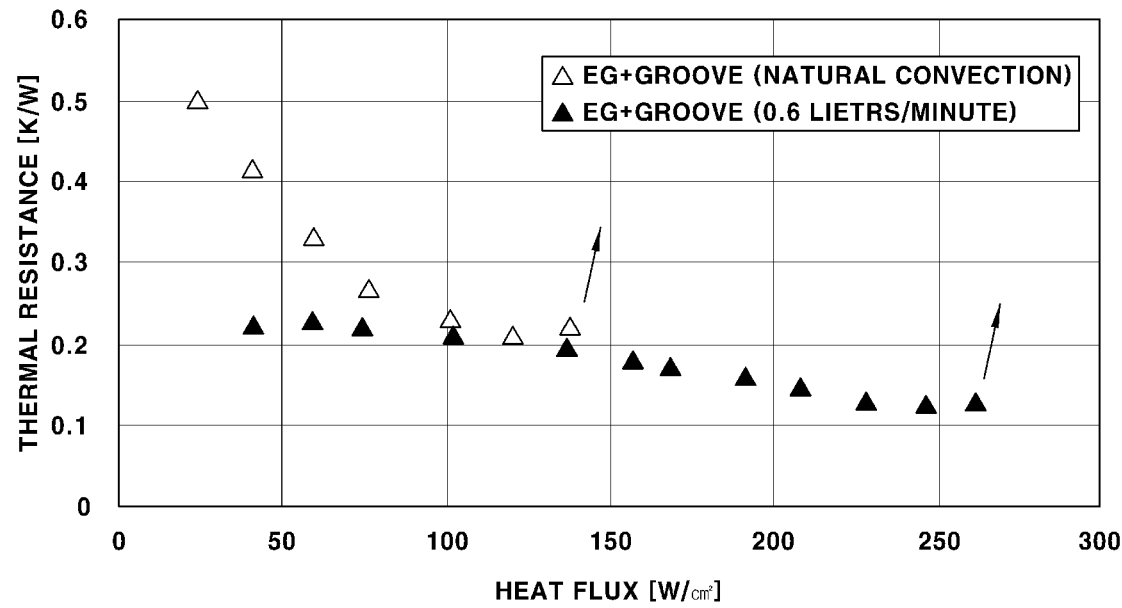
FIG. 12 is a graph illustrating a relation between the heat flux and the thermal resistance.

Natural convection and forced convection in the case in which the flat heat radiating face and the antifreeze solution are used were compared. FIG. 12 is a graph showing a relation between the heat flux and the thermal resistance. Natural convection and forced convection in the case in which the heat radiating face on which the groove is formed and the antifreeze solution are used were compared. As illustrated in FIG. 11, when the antifreeze solution is used on the flat heat radiating face, the critical heat flux and the thermal resistance obtained in natural convection become 120 W/cm$^2$ and 0.4 K/W, respectively, and the critical heat flux and the thermal resistance obtained in forced convection become 210 W/cm$^2$ and 0.25 K/W, respectively. As illustrated in FIG. 12, when the antifreeze solution is used on the heat radiating face on which the groove is provided, the critical heat flux and the thermal resistance obtained in natural convection become 148 W/cm$^2$ and 0.2 K/W, respectively, and the critical heat flux and the thermal resistance obtained in forced convection become 260 W/cm$^2$ and 0.12 K/W, respectively. Accordingly, it can be seen that when the groove is provided on the heat radiating face, it is possible to significantly improve the critical heat flux and the thermal resistance.

Figure 13:
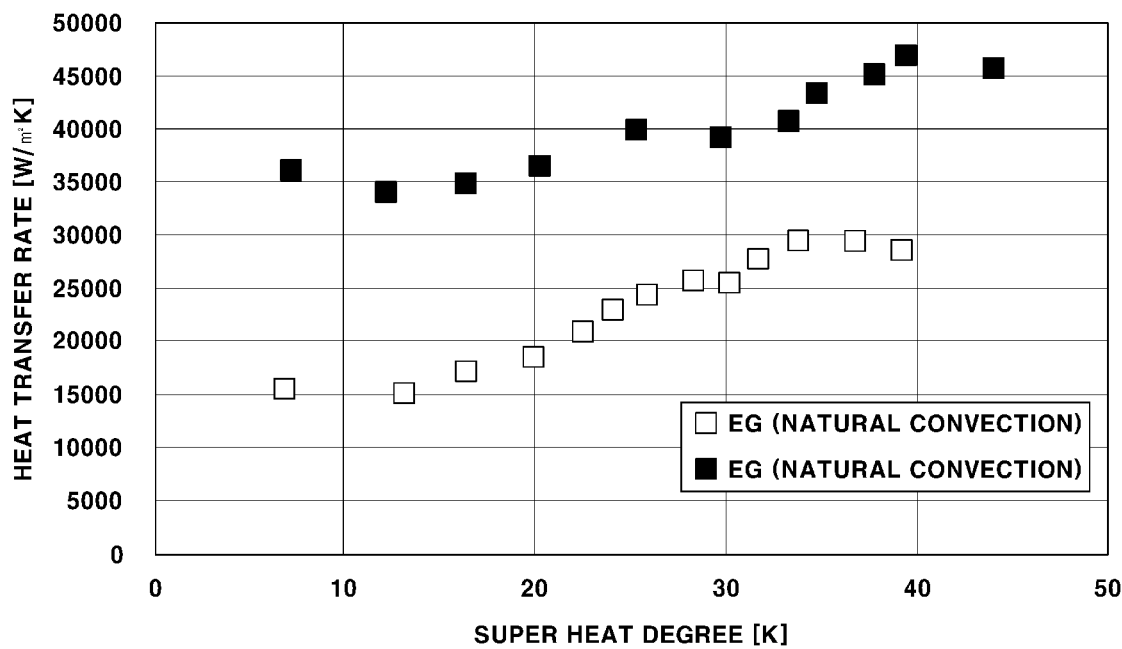
FIG. 13 is a graph illustrating a relation between a super heat degree and a heat transfer rate.
Figure 14:
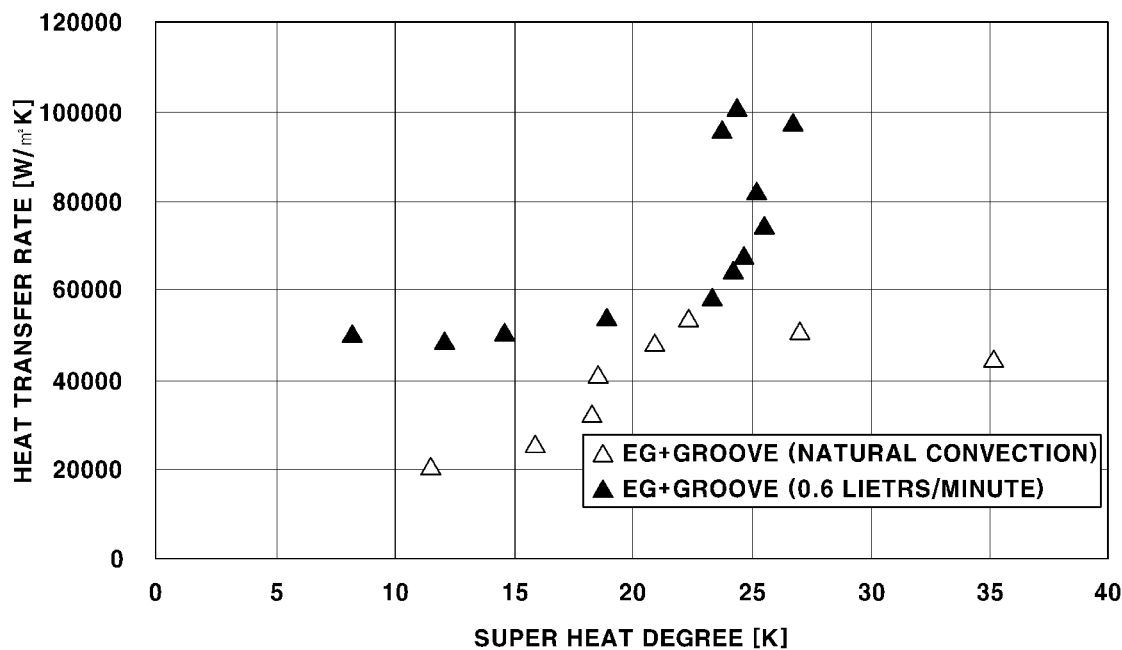
FIG. 14 is a graph illustrating a relation between the super heat degree and the heat transfer rate.
Figure 15:
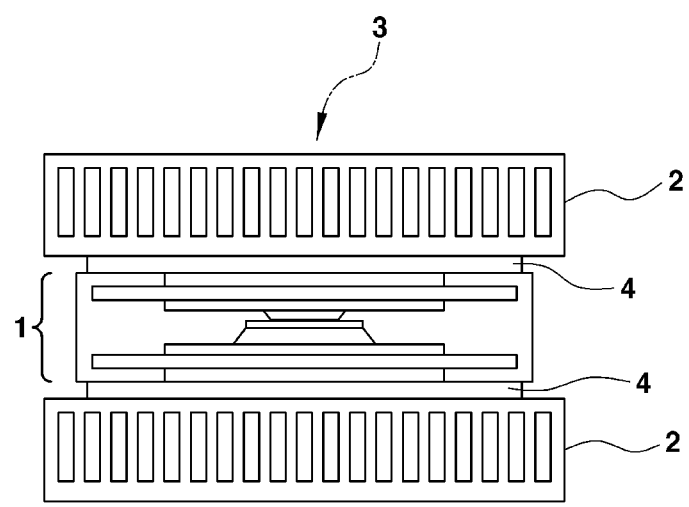
FIG. 15 (RELATED ART) is a view illustrating an example of a conventional double-side cooling type power semiconductor.

FIG. 13 is a graph illustrating a relation between a super heat degree and the heat transfer rate. Natural convection and forced convection in the case in which the flat heat radiating face and the antifreeze solution are used were compared. FIG. 14 is a graph illustrating a relation between the super heat degree and the heat transfer rate. Natural convection and forced convection in the case in which the heat radiating face on which the groove is formed and the antifreeze solution are used were compared.

As illustrated in FIG. 13, when the antifreeze solution is used on the flat heat radiating face, the heat transfer rate obtained by natural convection becomes maximally 30 kW/m$^2$K, and the heat transfer rate obtained in forced convection may be maximum 47 kW/m$^2$K.

As illustrated in FIG. 14, when the antifreeze solution is used on the heat radiating face on which the groove is provided, the heat transfer rate obtained by natural convection becomes maximally 55 kW/m$^2$K, and the heat transfer rate obtained in forced convection becomes maximally 100 kW/m$^2$K. Accordingly, it can be seen that, when the grooves are provided on the heat radiating face, it is possible to significantly improve the heat transfer rate.

The boiling cooling device according to the present invention can efficiently cool the power semiconductor, so that it is very suitable to employ as a boiling cooling apparatus mounted in a vehicle.

According to the boiling cooling device according to the present disclosure, since the plurality of fine longitudinal grooves extending in the vertical direction are provided on the heat radiating plate, it is possible to suppress growth of the air bubbles 7 and to maintain the air bubbles 7 to have a smaller diameter. Small air bubbles 7 are liable to liquefy in a flow passage and in the condenser. Further, since the air bubbles 7 rise in the vertical direction, the heat flux can be improved. In particular, the heat flux of about 250 W/cm$^2$ can be realized on one side of the power semiconductor, and when the heat fluxes on both sides of the power semiconductor are summed, the heat flux of about 500 W/cm² can be obtained.

According to another boiling cooling device of the present disclosure, due to the mesh-shaped grooves provided with the plurality of fine transverse grooves extending in a direction intersecting the fine longitudinal grooves, a contact area between the refrigerant and the heat radiating face of the heat radiating plate can be further increased to increase creation of the air bubbles and the effect that is equivalent to or better than the case where only the fine longitudinal grooves are provided can be obtained.

Since the longitudinal groove is formed to have a groove width of 50 μm or less, this groove can create small air bubbles. In small air bubbles and large air bubbles, large air bubbles rise fast, but small air bubbles are efficient for condensation. In other words, small air bubbles can enhance heat radiating performance.

Since the fine longitudinal groove is formed by laser machining for the heat radiating face, a mask is unnecessary as compared with an etching process and this longitudinal groove can be easily manufactured although it is slightly rough.

Although the present disclosure has been shown and described with reference to preferred embodiments thereof for illustrating a principle of the present disclosure, the present disclosure is not limited to the structure and the operation described with reference to the drawings in the above embodiments, and it will be appreciated by those skilled in the art that numerous changes and modifications of the disclosure are possible without departing from the spirit and scope defined in the appended claims.

What is claimed is:

1. A boiling cooling device, comprising:
   a power semiconductor that is vertically disposed;
   heat radiating plates provided on left and right side faces of the power semiconductor, respectively;
   heat receiving jackets provided at left and right sides of the power semiconductor, and configured to cover the heat radiating plates, respectively;
   refrigerant filled in the heat receiving jackets and configured to be in direct contact with the heat radiating plates;
   a condenser connected to the heat receiving jackets via a forward pipe and a return pipe; and
   a plurality of fine longitudinal grooves formed on a heat radiating face of the heat radiating plate and extending in a vertical direction,
   wherein heat generated in the power semiconductor and the fine longitudinal groove provided on the heat radiating face are configured to create air bubbles that rise and pass through the forward pipe and then reach the condenser to be liquefied, such that liquid is returned to the heat receiving jackets via the return pipe.

2. The boiling cooling device of claim 1, wherein each of the fine longitudinal grooves has a width of 50 μm or less.

3. The boiling cooling device of claim 2, wherein each of the fine longitudinal grooves is formed by laser machining of the heat radiating face.

4. The boiling cooling device of claim 1, wherein each of the fine longitudinal grooves is formed by laser machining of the heat radiating face.

5. A boiling cooling device, comprising:
   a power semiconductor that is vertically disposed;
   heat radiating plates provided on left and right side faces of the power semiconductor, respectively;
   heat receiving jackets provided at left and right sides of the power semiconductor, and configured to cover the heat radiating plates, respectively;
   refrigerant filled in the heat receiving jackets and configured to be in direct contact with the heat radiating plates;
   a condenser connected to the heat receiving jackets via a forward pipe and a return pipe; and
   mesh-shaped grooves formed on a heat radiating face of the heat radiating plate and comprising a plurality of fine longitudinal grooves extending in a vertical direction and a plurality of fine transverse grooves intersecting the fine longitudinal grooves and extending in a horizontal direction,
   wherein heat generated in the power semiconductor and the mesh-shaped grooves provided on the heat radiating face are configured to create air bubbles that rise and pass through the forward pipe and then reach the condenser to be liquefied, such that liquid is returned to the heat receiving jacket via the return pipe.

6. The boiling cooling device of claim 5, wherein each of the fine longitudinal grooves has a width of 50 μm or less.

7. The boiling cooling device of claim 6, wherein each of the fine longitudinal grooves is formed by laser machining of the heat radiating face.

8. The boiling cooling device of claim 5, wherein each of the fine longitudinal grooves is formed by laser machining of the heat radiating face.

* * * * *